(12) United States Patent
Hwang et al.

(10) Patent No.: US 10,153,137 B2
(45) Date of Patent: Dec. 11, 2018

(54) SUPPORT UNIT, SUBSTRATE TREATING APPARATUS INCLUDING THE SAME, AND METHOD FOR TREATING A SUBSTRATE

(71) Applicant: SEMES CO., LTD., Cheonan-si, Chungcheongnam-do (KR)

(72) Inventors: Seok Won Hwang, Busan (KR); Kisang Eum, Cheonan-si (KR); Sun Wook Jung, Hwaseong-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 20 days.

(21) Appl. No.: 15/293,393

(22) Filed: Oct. 14, 2016

(65) Prior Publication Data

US 2017/0110295 A1    Apr. 20, 2017

(30) Foreign Application Priority Data

Oct. 16, 2015    (KR) .................. 10-2015-0144885

(51) Int. Cl.
*H01J 37/32* (2006.01)

(52) U.S. Cl.
CPC .... *H01J 37/32697* (2013.01); *H01J 37/3244* (2013.01); *H01J 37/3266* (2013.01); *H01J 37/32642* (2013.01); *H01J 37/32724* (2013.01); *H01J 2237/151* (2013.01); *H01J 2237/1502* (2013.01); *H01J 2237/334* (2013.01)

(58) Field of Classification Search
USPC ................ 118/728–733; 156/345.51–345.55
See application file for complete search history.

(56) References Cited

U.S. PATENT DOCUMENTS

| 5,246,532 A | * | 9/1993 | Ishida | H01J 37/32623 118/723 MA |
| 2009/0242135 A1 | * | 10/2009 | Koshimizu | H01J 37/32091 156/345.48 |
| 2012/0061351 A1 | * | 3/2012 | Ohata | H01J 37/32091 216/67 |
| 2015/0227044 A1 | * | 8/2015 | Li | G03F 7/16 118/500 |

FOREIGN PATENT DOCUMENTS

| JP | 2501948 B2 | 5/1996 |
| JP | 2006-044075 A | 2/2006 |
| JP | 2009-112129 A | 5/2009 |
| JP | 5317424 B2 | 10/2013 |
| KR | 10-0308987 B1 | 9/2001 |
| KR | 2008-0001163 A | 1/2008 |
| KR | 10-2008-0023569 A | 3/2008 |
| KR | 10-1131022 B1 | 3/2012 |
| KR | 10-1155837 B1 | 6/2012 |

* cited by examiner

*Primary Examiner* — Parviz Hassanzadeh
*Assistant Examiner* — Tiffany Z Nuckols
(74) *Attorney, Agent, or Firm* — Harness, Dickey & Pierce, P.L.C.

(57) ABSTRACT

The inventive concepts provide a substrate treating apparatus. The substrate treating apparatus includes a process chamber in which a treatment space is provided, a support unit supporting a substrate in the process chamber, a gas supply unit supplying a gas into the process chamber, and a plasma source generating plasma from the gas. The support unit includes a support plate on which a substrate is loaded, a focus ring disposed to surround the support plate, an electric field adjusting ring disposed under the focus ring, and an actuator vertically moving the electric field adjusting ring.

29 Claims, 14 Drawing Sheets

SUPPORT UNIT, SUBSTRATE TREATING APPARATUS INCLUDING THE SAME, AND METHOD FOR TREATING A SUBSTRATE

CROSS-REFERENCE TO RELATED APPLICATION

This U.S. Non-Provisional Patent Application claims priority under 35 U.S.C. § 119 to Korean Patent Application No. 10-2015-0144885, filed on Oct. 16, 2015, in the Korean Intellectual Property Office, the disclosure of which is hereby incorporated by reference in its entirety.

BACKGROUND

Embodiments of the inventive concepts relate to a support unit, a substrate treating apparatus including the same, and a method for treating a substrate.

Plasma is generated by very high temperature, a strong electric field, or radio-frequency (RF) electromagnetic fields. The plasma means an ionized gas state including ions, electrons, and/or radicals. When a semiconductor device is manufactured, an etching process using plasma may be performed. Ion particles contained in the plasma may collide with a substrate, and thus the etching process may be performed.

FIG. 1 shows a focus ring before and after a substrate treating process in a substrate treating apparatus. A transverse X-axis means a distance from a center of a support unit. A longitudinal Y-axis means a thickness of the focus ring. The focus ring may also be etched when a process of etching a substrate is performed using plasma, and thus the thickness of the focus ring may be reduced.

FIG. 2. shows an incident path of etching ions incident toward a pattern of a substrate. A right solid arrow shows an incident direction of the etching ions in an early stage of a process. When RF power is supplied to an electrode plate of a support unit, an electric field may be generated over the electrode plate, and an incident angle of the etching ions may be affected while the etching ions pass through the electric field. In the early stage of the process, the etching ions may be incident toward the focus ring (i.e., an edge of the substrate). When the focus ring is etched while performing the process, the electric field may be changed. Thus, the incident angle of the etching ions may be changed. As the process proceeds, the incident direction of the etching ions may move toward a center of the substrate. A dashed line arrow shows an incident direction of etching ions after the process or in a later stage of the process. In the example of FIG. 2, the incident angle of the etching ions may be changed counterclockwise. Thus, an undesired surface of the substrate may be etched to lower the accuracy of the process. A slope critical dimension (SCD) means a horizontal distance from a center of a depressed portion between patterns of the substrate to a point on which the etching ions are incident. A direction from the center of the depressed portion toward the focus ring (i.e., the edge of the substrate) has a positive value, and a direction toward a center of the substrate has a negative value.

FIG. 3 is a graph showing a variation of a slope critical dimension (SCD) according to a process time. The SCD may be gradually reduced as the process time passes. In other words, the incident direction of the etching ions may be changed in the direction toward the center of the substrate. Thus, a spot different from a desired etching spot may be etched to deteriorate the accuracy and efficiency of the etching process. Meanwhile, to prevent these problems, the focus ring may be periodically replaced with new one. However a replacement period of the focus ring may be short and a maintenance cost of the focus ring may increase.

SUMMARY

Embodiments of the inventive concepts may provide an apparatus and a method for treating a substrate, which are capable of improving or increasing accuracy and efficiency of an etching process.

Embodiments of the inventive concepts may also provide an apparatus and a method for treating a substrate, which are capable of reducing a cost that is necessary for replacement or maintenance of a focus ring.

In an aspect, a substrate treating apparatus may include: a process chamber in which a treatment space is provided; a support unit supporting a substrate in the process chamber; a gas supply unit supplying a gas into the process chamber; and a plasma source generating plasma from the gas. The support unit may include: a support plate on which a substrate is loaded; a focus ring disposed to surround the support plate; an electric field adjusting ring disposed under the focus ring; and an actuator vertically moving the electric field adjusting ring.

In some embodiments, the support unit may further include: a body ring disposed under the focus ring. The body ring may be coupled to the focus ring to provide an inner space. The electric field adjusting ring may be vertically moved in the inner space.

In some embodiments, the actuator may vertically move the electric field adjusting ring by magnetic force.

In some embodiments, the actuator may include: a first magnetic force member fixed to the electric field adjusting ring; and a second magnetic force member facing the first magnetic force member and provided in the inner space.

In some embodiments, the first magnetic force member may be fixed on a bottom surface of the electric field adjusting ring, and the second magnetic force member may be provided on a bottom surface of the inner space.

In some embodiments, one of the first and second magnetic force members may include: a body formed of a conductive material; and a coil surrounding the body. The other of the first and second magnetic force members may be a magnetic body. The actuator further may include: a current supply part supplying a current to the coil. Repulsive force may be applied between the first magnetic force member and the second magnetic force member when the current flows through the coil.

In some embodiments, the first magnetic force member may include: a first body formed of a conductive material; and a first coil spaced apart from the first body and surrounding the first body. The second magnetic force member may include: a second body formed of a conductive material; and a second coil spaced apart from the second body and surrounding the second body. The actuator may further include: a current supply part supplying a current to the first coil and the second coil. Repulsive force may be applied between the first magnetic force member and the second magnetic force member when the current is supplied to the first coil and the second coil.

In some embodiments, at least one of the first and second magnetic force members may be provided in a film form.

In some embodiments, the actuator may further include: a controller adjusting an intensity of the current supplied from the current supply part. The controller may adjust the intensity of the current when a condition of a process reaches a set condition.

In some embodiments, the actuator may vertically move the electric field adjusting ring by hydraulic pressure or air pressure.

In some embodiments, the actuator may include: a fluid supply pipe supplying a fluid into a region under the electric field adjusting ring in the inner space.

In some embodiments, the actuator may further include: a flow rate adjuster adjusting a flow ate of the fluid supplied into the inner space through the fluid supply pipe; and a controller controlling the flow rate adjuster. The controller may control the flow rate adjuster to change the flow rate of the fluid when a condition of a process reaches a set condition.

In some embodiments, a bearing may he provided on a sidewall of the electric field adjusting ring, and a concave region may be formed in a sidewall of the inner space such that a portion of the bearing is inserted into the concave region.

In some embodiments, the concave region may be provided in plurality in an up-and-down direction.

In some embodiments, distances between the concave regions arranged in the up-and-down direction may be different from each other.

In an aspect, a support unit may include: a support plate on which a substrate is loaded; a focus ring disposed to surround the support plate; an electric field adjusting ring disposed under the focus ring; and an actuator vertically moving the electric field adjusting ring.

In some embodiments, the support unit may further include: a body ring disposed under the focus ring, the body ring coupled to the focus ring to provide an inner space. The electric field adjusting ring may be vertically moved in the inner space.

In some embodiments, the actuator may vertically move the electric field adjusting ring by magnetic force.

In some embodiments, the actuator may include: a first magnetic force member fixed to the electric field adjusting ring; and a second magnetic force member facing the first magnetic force member and provided in the inner space. The first magnetic force member may be fixed on a bottom surface of the electric field adjusting ring, and the second magnetic force member may be provided on a bottom surface of the inner space.

In some embodiments, one of the first and second magnetic force members may include: a body formed of a conductive material; and a coil surrounding the body. The other of the first and second magnetic force members may be a magnetic body. The actuator may further include: a current supply part supplying a current to the coil. Repulsive force may be applied between the first magnetic force member and the second magnetic force member when the current flows through the coil.

In some embodiments, the first magnetic force member may include: a first body formed of a conductive material; and a first coil spaced apart from the first body and surrounding the first body. The second magnetic force member may include: a second body formed of a conductive material; and a second coil spaced apart from the second body and surrounding the second body. The actuator may further include: a current supply part supplying a current to the first coil and the second coil. Repulsive force may be applied between the first magnetic force member and the second magnetic force member when the current is supplied to the first coil and the second coil.

In some embodiments, at least one of the first and second magnetic force members may be provided in a film form.

In some embodiments, the actuator may vertically move the electric field adjusting ring by hydraulic pressure or air pressure.

In some embodiments, the actuator may include: a fluid supply pipe supplying a fluid into a region under the electric field adjusting ring in the inner space.

In some embodiments, a bearing may be provided on a sidewall of the electric field adjusting ring, and a concave region may be formed in a sidewall of the inner space such that a portion of the bearing is inserted into the concave region.

In some embodiments, the concave region may be provided in plurality in an up-and-down direction.

In some embodiments, distances between the concave regions arranged in the up-and-down direction may be different from each other.

In an aspect, a method for treating a substrate may include: adjusting an incident angle of etching ions incident on the substrate by vertically moving an electric field adjusting ring disposed under a focus ring supporting a side portion of the substrate.

In some embodiments, the electric field adjusting ring may be vertically moved in an inner space formed by a combination of the focus ring and a body ring disposed under the focus ring.

In some embodiments, the electric field adjusting ring may be raised when reaching a set condition.

In some embodiments, raising the electric field adjusting ring may be performed a plurality of times stepwise.

In some embodiments, the electric field adjusting ring may be raised by magnetic force.

In some embodiments, the electric field adjusting ring may be raised by hydraulic pressure or air pressure.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
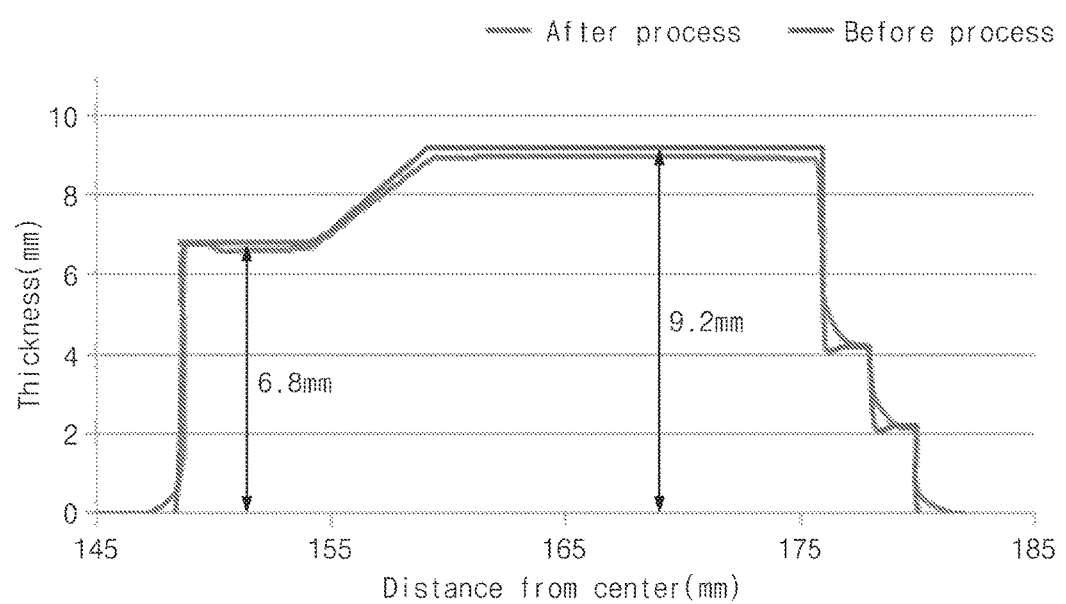
FIG. 1 is a diagram showing a focus ring before and after a substrate treating process in a substrate treating apparatus.
Figure 2:
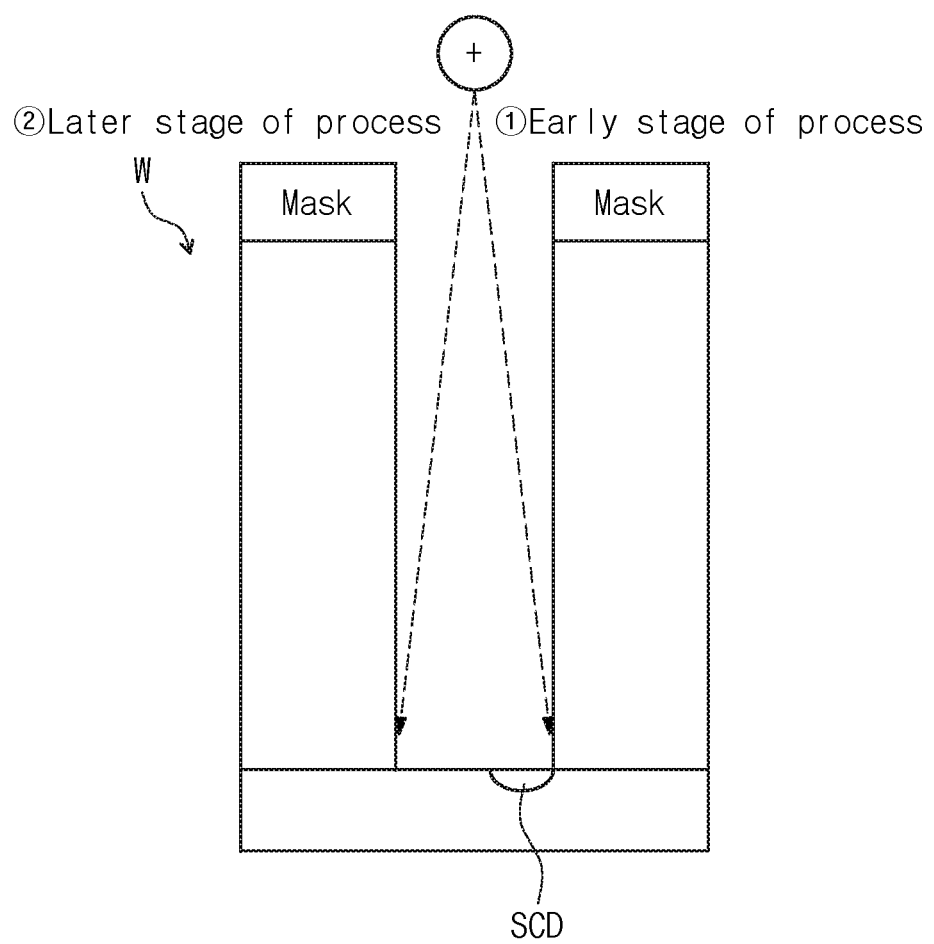
FIG. 2 is a diagram showing an incident path of etching ions incident toward a pattern of a substrate.
Figure 3:
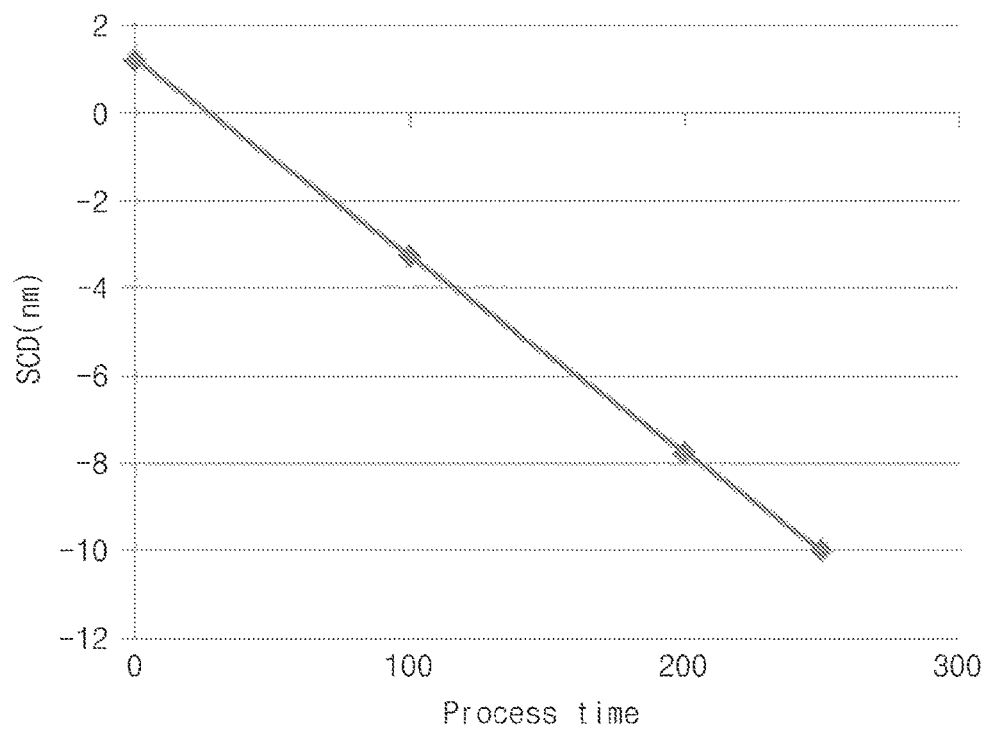
FIG. 3 is a graph showing a variation of a slope critical dimension according to a process time.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

Embodiments of the inventive concepts may provide a substrate treating apparatus that etches a substrate by using plasma. However, embodiments of the inventive concepts are not limited thereto. Embodiments of the inventive concepts may be applied to various kinds of apparatuses performing a process by supplying plasma in a chamber.

Figure 4:
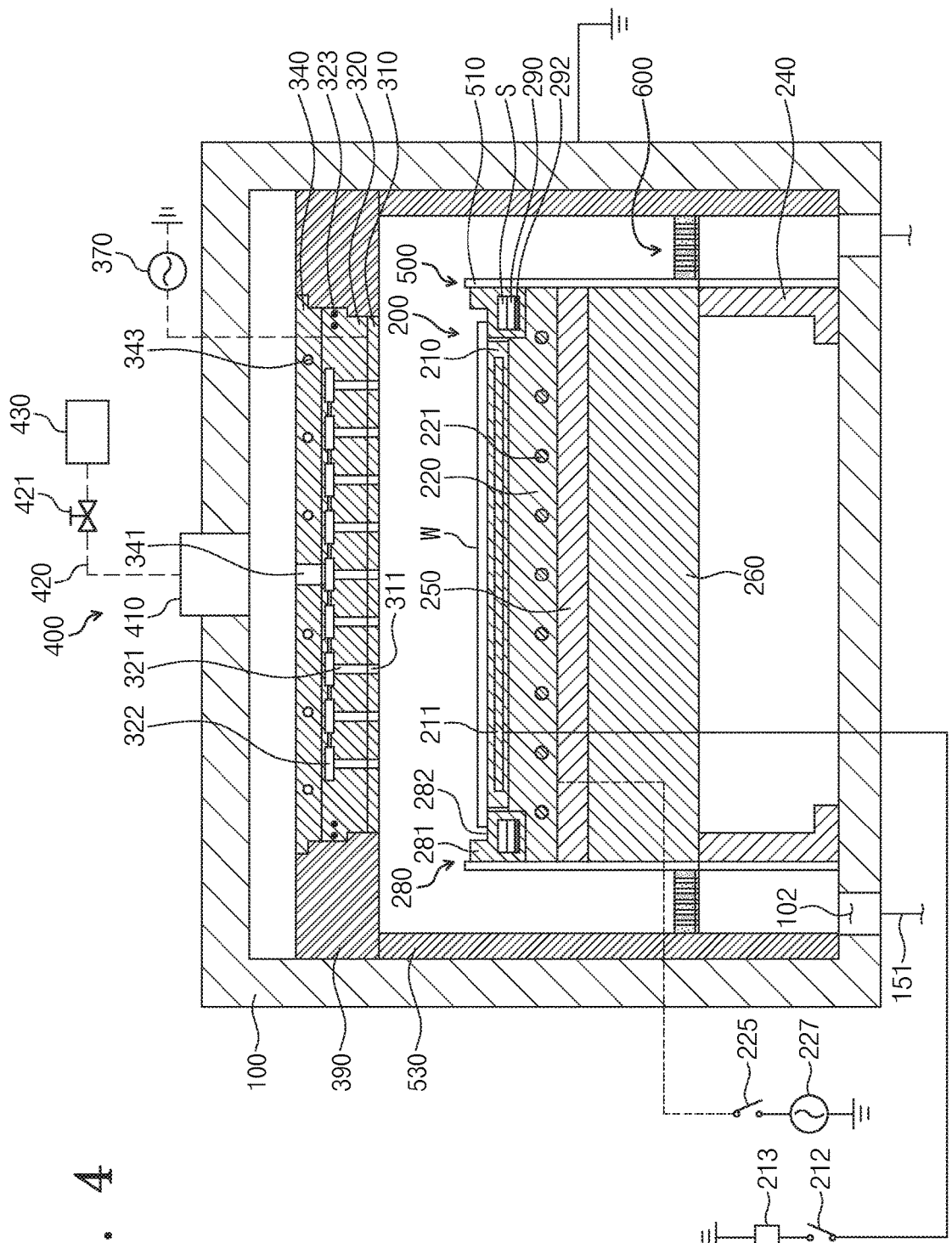
FIG. 4 is a view showing a substrate treating apparatus according to some embodiments of the inventive concepts.
Figure 5:
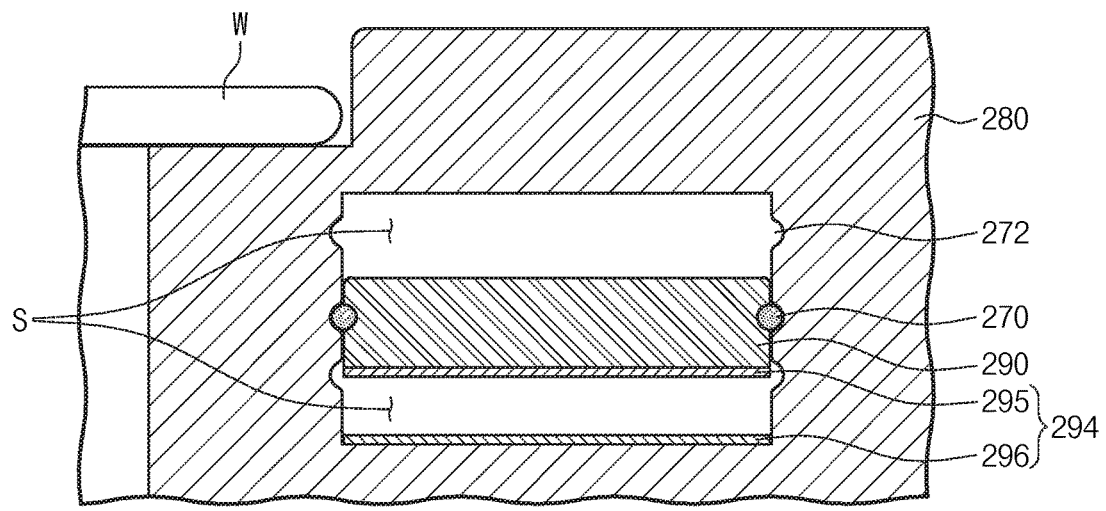
FIG. 5 is a view showing a support unit according to some embodiments of the inventive concepts.

FIG. 4 is a schematic view showing a substrate treating apparatus according to some embodiments of the inventive concepts, and FIG. 5 is a view showing a support unit according to some embodiments of the inventive concepts. Hereinafter, a substrate treating apparatus according to the inventive concepts will be described with reference to FIGS. 4 and 5.

A substrate treating apparatus 10 may treat a substrate W by using plasma. The substrate treating apparatus 10 may include a chamber 100, a support unit 200, a shower head unit 300, a gas supply unit 400, a plasma source, a liner unit 500, and a baffle unit 600.

The chamber 100 may provide a treatment space in which a process of treating a substrate is performed. In other words, the chamber 100 may have the treatment space disposed therein. The chamber 100 may be provided in a sealed form. The chamber 100 may be formed of a metal material. For example, the chamber 100 may be formed of an aluminum material. The chamber 100 may be grounded. An exhaust hole 102 may be formed in a bottom plate of the chamber 100. The exhaust hole 102 may be connected to an exhaust line 151. The exhaust line 151 may be connected to a pump (not shown). Reaction by-products generated in a process and a gas remaining in the inner space of the chamber after the process may be exhausted to the outside of the chamber 100 through the exhaust line 151. An inner pressure of the chamber 100 may be reduced to a predetermined pressure by the exhausting process.

The support unit 200 may be disposed in the chamber 100. The support unit 200 may support the substrate W. The support unit 200 may be an electrostatic chuck that adsorbs the substrate W by using electrostatic force. Alternatively, the support unit 200 may support the substrate W by at least one of other various methods such as a mechanical clamping method. Hereinafter, the support unit 100 corresponding to the electrostatic chuck will be described as an example.

The support unit 200 may include a support plate 210, an electrode plate 220, a lower plate 240, a plate 250, a lower board 260, a focus ring 280, an electric field adjusting ring 290, a body ring 292, an actuator 294, and a controller 298.

A substrate W may be loaded on the support plate 210. The support plate 210 may have a circular plate shape. The support plate 210 may be formed of a dielectric substance. A radius of a top surface of the support plate 210 may be smaller than that of the substrate W. When the substrate W is loaded on the support plate 210, an edge region of the substrate W may be located outside the support plate 210. The support plate 210 may be supplied with an external power source to provide electrostatic force to the substrate W. An electrostatic electrode 211 may be provided in the support plate 210. The electrostatic electrode 211 may be electrically connected to an adsorption power source 213. The adsorption power source 213 may include a direct current (DC) power source. A switch 212 may be installed between the electrostatic electrode 211 and the adsorption power source 213. The electrostatic electrode 211 may be electrically connected to the adsorption power source 213 by on/off operation of the switch 212. When the switch 212 is turned-on, a DC current may be applied to the electrostatic electrode 211. Electrostatic force may be applied between the electrostatic electrode 211 and the substrate W by the current applied to the electrostatic electrode 211. The substrate W may be adsorbed on the support plate 210 by the electrostatic force.

The electrode plate 220 may be provided under the support plate 210. A top surface of the electrode plate 220 may be in contact with a bottom surface of the support plate 210. The electrode plate 220 may have a circular plate shape. The electrode plate 220 may be formed of a conductive material. For example, the electrode plate 220 may he formed of an aluminum material. An upper central region of the electrode plate 220 may have an area corresponding to an area of the bottom surface of the support plate 210.

An upper fluid path 221 may be provided within the electrode plate 220. The upper fluid path 221 may mainly cool the support plate 210. A cooling fluid may be supplied to the upper fluid path 221. For example, the cooling fluid may be cooling water or cooling gas.

The electrode plate 220 may include a metal plate. In some embodiments, an entire portion of the electrode plate 220 may be the metal plate. The electrode plate 220 may be electrically connected to a lower power source 227. The lower power source 227 may be a high-frequency power source generating high-frequency power. The high-frequency power source may be a radio-frequency (RF) power source. The RF power source may be a high bias power RF source. The electrode plate 220 may be supplied with the high-frequency power from the lower power source 227. Thus, the electrode plate 220 may function as an electrode. The electrode plate 220 may be provided to be grounded.

The plate 250 may be provided under the electrode plate 220. The plate 250 may have a circular plate shape. The plate 250 may have an area corresponding to the electrode plate 220. The plate 250 may be an insulating plate. For example, the plate 250 may be formed of a dielectric substance.

The lower board 260 may be disposed under the plate 250. The lower board 260 may be formed of an aluminum material. The lower board 260 may have a circular shape when viewed from a top view. A lift pin module (not shown) may be located in an inner space of the lower board 260. The lift pin module (not shown) may be used to move a transferred substrate W from an external transfer member onto the support plate 210.

The lower plate 240 may be provided under the lower board 260. The lower plate 240 may have a ring shape.

The focus ring 280 may be disposed at an edge region of the support unit 200. The focus ring 280 may have a ring shape. The focus ring 280 may surround an upper portion of the support plate 210. The focus ring 280 may include an inner portion 282 and an outer portion 281. The inner portion 282 may be disposed inside the focus ring 280. A top surface of the inner portion 282 may be lower than a top surface of the outer portion 281, The top surface of the inner portion 282 may be disposed at the same height as a top surface of the support plate 210. The inner portion 282 may support the edge region of the substrate W, which is disposed outside the support plate 210. The outer portion 281 may be disposed outside the inner portion 282. When the substrate W is loaded on the support plate 210, the outer portion 281 may be disposed to face a sidewall portion of the substrate W. The outer portion 281 may be provided to surround the edge region of the substrate W.

Referring to FIG. 5, the body ring 292 may be disposed under the focus ring 280. The body ring 292 may be coupled to the focus ring 280 to provide an inner space S. The body ring 292 may be formed of a conductive material. For example, the body ring 292 may be formed of aluminum.

The electric field adjusting ring 290 may be disposed under the focus ring 280. The electric field adjusting ring 290 may be provided in the inner space S. The electric field adjusting ring 290 may be inserted in the inner space S and may be vertically moved in the inner space S. The electric field adjusting ring 290 may be formed of a conductive material. For example, the electric field adjusting ring 290 may be formed of aluminum.

Figure 6:
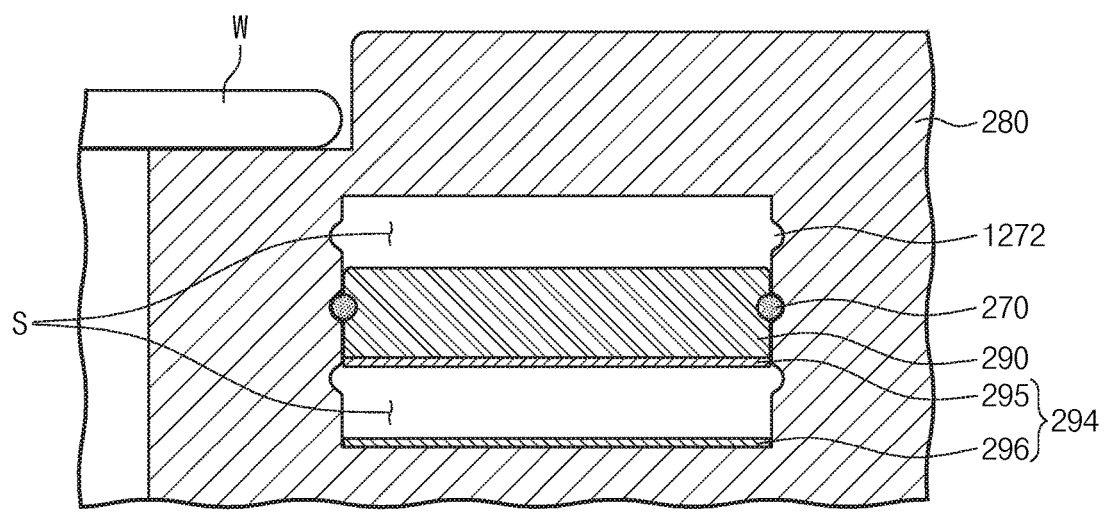
FIG. 6 is a view showing a support unit according to other embodiments of the inventive concepts.

A bearing 270 may be provided on a sidewall of the electric field adjusting ring 290. In some embodiments, a pair of bearings 270 may be provided on an inner sidewall and an outer sidewall of the electric field adjusting ring 290, respectively. The bearings 270 may be disposed at the same height on the inner and outer sidewalls of the electric field adjusting ring 290. A portion of the bearing 270 may be inserted in the sidewall of the electric field adjusting ring 290. A concave region 272 may be formed in a sidewall of the inner space S. A residual portion of the bearing 270 may be inserted in the concave region 272. The bearing 270 may be inserted in the sidewall of the electric field adjusting ring 290 and in the concave region 272 of the sidewall of the inner space 272, and thus the bearing 270 and the electric field adjusting ring 290 may be fixed at a predetermined height. The concave 272 may be provided in plurality in an up-and-down direction. Thus, the electric field adjusting ring 290 may be raised stepwise by the actuator 294 to be described later. Distances between the concave regions 272 arranged in the up-and-down direction may be different from each other. Alternatively, as illustrated in FIG. 6, distances between concave regions 1272 arranged in the up-and-down direction may be equal to each other.

Figure 7:
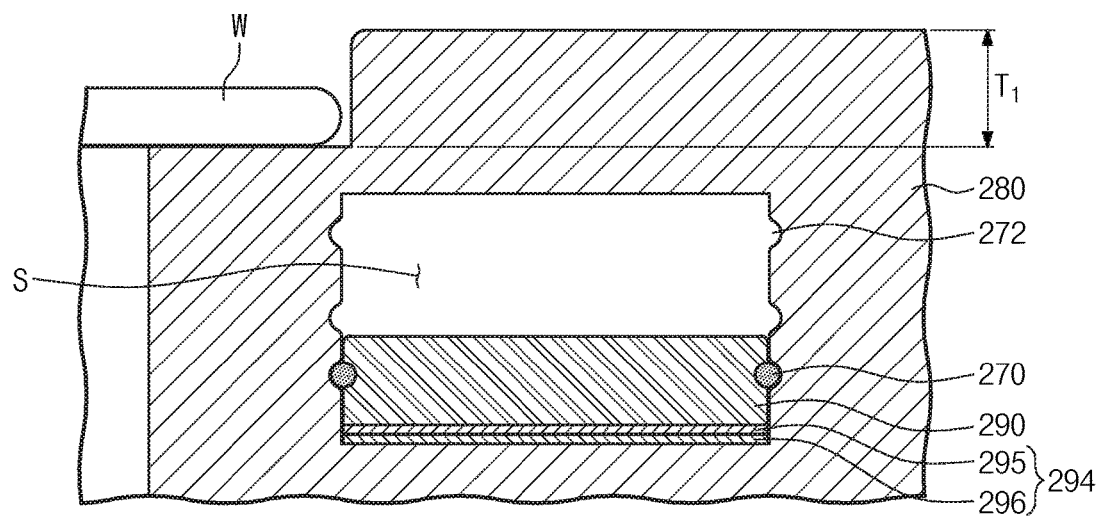
FIGS. 7 to 9 are views showing a method for raising an electric field adjusting ring according to sonic embodiments of the inventive concepts.
Figure 8:
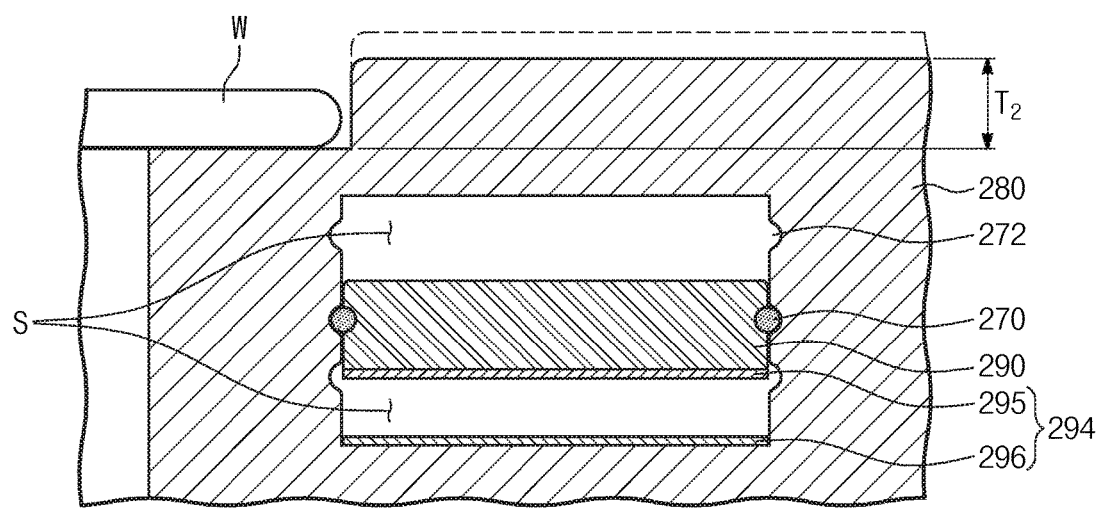
Figure 9:
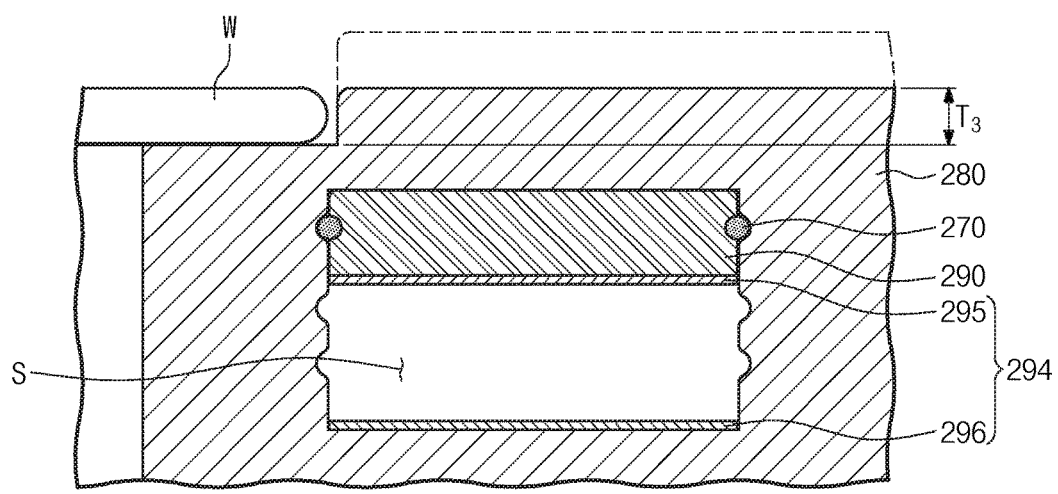

FIGS. 7 to 9 are views showing a method for raising an electric field adjusting ring 290 according to some embodiments of the inventive concepts.

Referring to FIGS. 7 to 9, the actuator 294 may move the electric field adjusting ring 290 in the up-and-down direction. In some embodiments, the actuator 294 may elevate the electric field adjusting ring 290 in the up-and-down direction by magnetic force. The actuator 294 may be a magnetic force member. The actuator 294 may include a first magnetic force member 295 and a second magnetic force member 296. The first magnetic force member 295 may be provided on a bottom surface of the electric field adjusting ring 290, The first magnetic force member 295 may be fixed on the bottom surface of the electric field adjusting ring 290. The second magnetic force member 296 may be provided to face the first magnetic force member 295. The second magnetic force member 296 may be provided in the inner space S. The second magnetic force member 296 may be fixed on a bottom surface of the inner space S. For example, the second magnetic force member 296 may be fixed on a top surface of the body ring 292.

Repulsive force may be applied between the first magnetic force member 295 and the second magnetic force member 296 by the magnetic force. The electric field adjusting ring 290 may be raised by the repulsive force. The intensity of the repulsive force can be adjusted.

FIG. 7 shows an early stage of a process, and a height of the focus ring 280 is T1 in FIG. 7. In FIG, 7, the electric field adjusting ring 290 may be adjacent diposed on the bottom surface of the inner space S. FIG. 8 shows a state in which the process proceeds. In FIG. 8, the focus ring 280 may be partially etched, and thus a height of the focus ring 280 may become T2. The height T2 is smaller than the height T2. At this time, the electric field adjusting ring 290 may be raised. FIG. 9 shows a later stage of the process. In FIG. 9, the focus ring 280 may be more etched, and thus a height of the focus ring 280 may become T3. The height T3 is smaller than the height T2. At this time, the electric field adjusting ring 290 may be more raised. In some embodiments, the electric field adjusting ring 290 may be raised as much as possible, and thus the electric field adjusting ring 290 may be in contact with a top surface of the inner space S.

Figure 10:
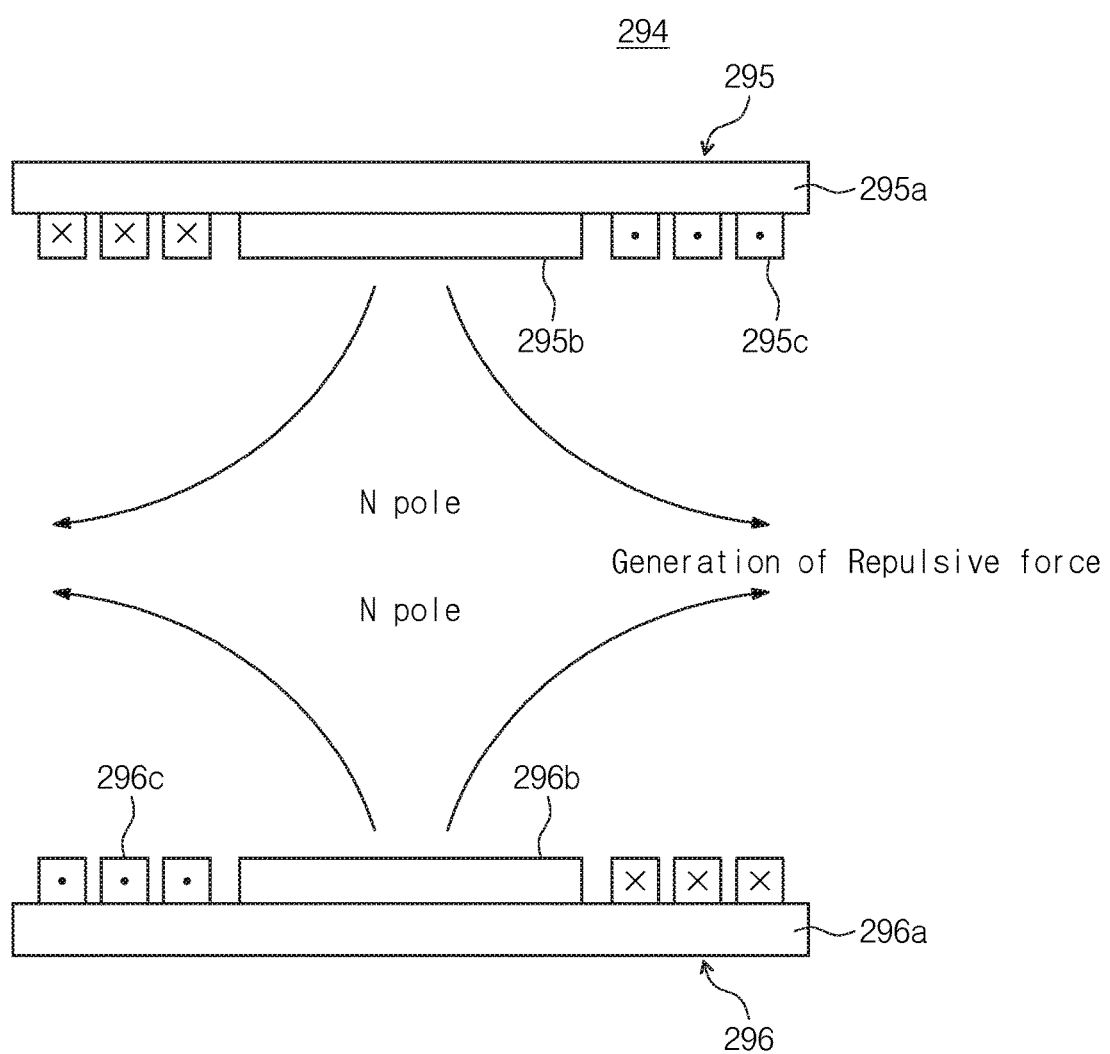
FIG. 10 is a view showing an actuator according to a first embodiment of the inventive concepts.
Figure 11:
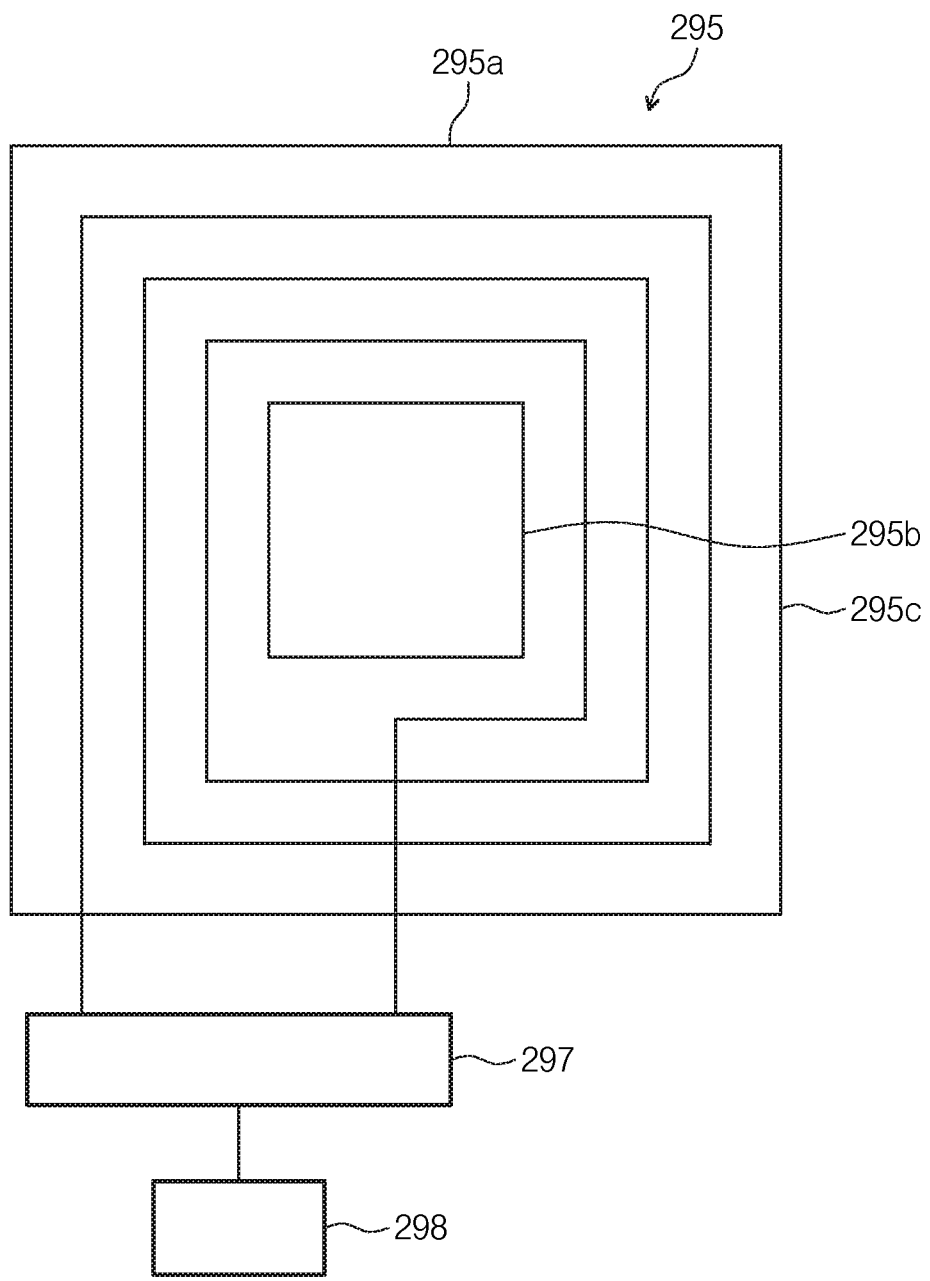
FIG. 11 is a plan view showing a magnetic force member of FIG. 9.

FIG. 10 is a view showing an actuator according to a first embodiment of the inventive concepts, and FIG. 11 is a plan view showing a magnetic force member of FIG. 9.

According to the first embodiment, the first magnetic force member 295 may include a first plate 295a, a first body 295b, and a first coil 295c. The first plate 295a may have a plate shape. The first body 295b may protrude from the first plate 295a. The first body 95b may be formed of a conductive material. The first coil 295c may be spaced apart from the first body 295b and may surround the first body 295b, current supplied from a current supply part 297 may flow to the first coil 295c. When the current flows through the first coil 295c, the magnetic force may be induced at the first magnetic force member 295. A north pole (N pole) or a south pole (S pole) may be induced according to a direction in which the first coil 295c surrounds the first body 295b.

The second magnetic force member 296 may include a second plate 296a, a second body 296b, and a second coil 296c. The second plate 296a may have a plate shape. The second body 296b may protrude from the second plate 296a. The second body 296b may be provided to face the first body 295b. The second body 296b may be formed of a conductive material. The second coil 296c may be spaced apart from the second body 296b and may surround the second body 296b. A current supplied from the current supply part 297 may flow to the second coil 296c. When the current flows through the second coil 296c, the magnetic force may be induced at the second magnetic force member 296. The N pole or the S pole may be induced according to a direction in which the second coil 296c surrounds the second body 296b.

Since the repulsive force should be applied between the first magnetic force member 295 and the second magnetic force member 296, the magnetic forces should be induced in such a way that the same poles face each other. Thus, the direction in which the first coil 295c surrounds the first body 295b may be the same as the direction in which the second coil 296c surrounds the second body 296b. For example, when a coil surrounds a body in a clockwise direction in a state in which a current flows through the coil, the N pole may be induced in a protruding direction of the body. Since the first magnetic force member 295 faces the second magnetic force member 296, the repulsive force may be applied between the first and second magnetic force members 295 and 296 by the N poles of the first and second magnetic force members 295 and 296. Since the first and second magnetic force members 295 and 296 are fixed on the bottom surface of the electric field adjusting ring 290 and the top surface of the body ring 292, respectively, the electric field adjusting ring 290 may be raised by the force applied to the first magnetic force member 295. An intensity of the magnetic force may be adjusted by adjusting intensities of the currents flowing through the first and second coils 295c and 296c. A magnitude of the repulsive force may be adjusted by this method, thereby controlling the ascent of the electric field adjusting ring 290.

Figure 12:
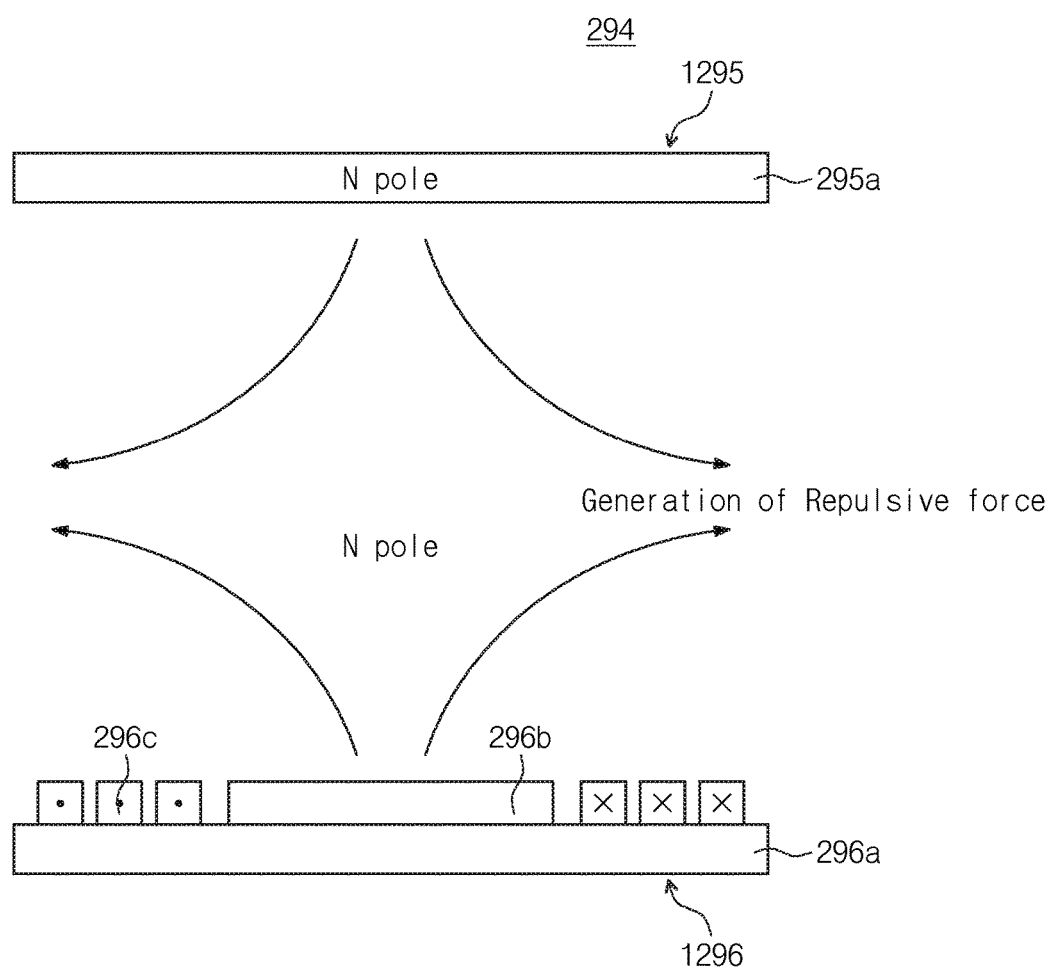
FIG. 12 is a view showing an actuator according to a second embodiment of the inventive concepts.

FIG. 12 is a view showing an actuator 1294 according to a second embodiment of the inventive concepts.

According to the second embodiment, one of first and second magnetic force members 1295 and 1296 may include a plate, a body, and a coil like the magnetic force member of the first embodiment described above, and the other of the first and second magnetic force members 1295 and 1296 may be a magnetic body. The first and second magnetic force members 1295 and 1296 may be provided such that repulsive force is applied between the first and second magnetic force members 1295 and 1296. For example, the first magnetic force member 1295 may be a magnetic body having an N pole. The coil 296c of the second magnetic force member 1296 may surround the body 296b of the second magnetic force member 1296 in a clockwise direction. Since the N poles are formed to face each other, the repulsive force may be applied between the first magnetic force member 1295 and the second magnetic force member 1296. At this time, an intensity of the induced magnetic force may be adjusted by adjusting an intensity of a current flowing through the coil 296c of the second magnetic force member 1296. A magnitude of the repulsive force may be adjusted by this method, thereby controlling the ascent of the electric field adjusting ring 290.

The controller 298 may control the current supply part 297. The controller 298 may adjust the intensity of the current supplied to the coil through the current supply part 297. When a greater amount of the current is supplied to the coil, the induced magnetic force may be strengthened. Thus, a raised height of the electric field adjusting ring 290 may be increased. The controller 298 may adjust the intensity of the current on the basis of a set condition. For example, when a slope critical dimension (SCD) exceeds a predetermined value, a stronger current may be supplied. Alternatively, when a process time exceeds a predetermined time, a stronger current may be supplied. When the strong current is supplied, the electric field adjusting ring 290 may be raised. When the electric field adjusting ring 290 is raised, an electric field may be changed. When the electric field is changed, it is possible to prevent an incident angle of etching ions on a substrate from being rapidly changed.

Figure 13:
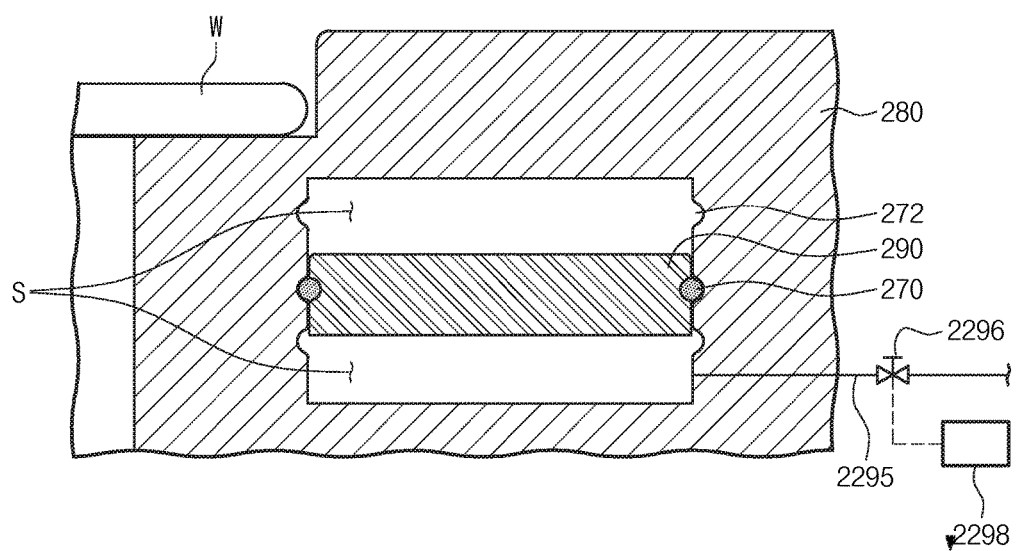
FIG. 13 is a view showing a support unit according to a third embodiment of the inventive concepts.

FIG. 13 is a view showing a support unit according to a third embodiment of the inventive concepts.

According to the third embodiment, the electric field adjusting ring 290 may be raised by fluid pressure (e.g., hydraulic pressure or air pressure). An actuator 2294 may include a fluid supply pipe 2295, a flow rate adjuster 2296, and a controller 2298.

The fluid supply pipe 2295 may supply a fluid into the inner space S. The fluid may be supplied into a space of the inner space S, which is between the bottom surface of the electric field adjusting ring 290 and the top surface of the body ring 292. The flow rate adjuster 2296 may adjust a flow rate of the fluid flowing through the fluid supply pipe 2295. In some embodiments, the flow rate adjuster 2296 may be a valve. The controller 2298 may control the flow rate adjuster 2296. The electric field adjusting ring 290 may be raised by pressure of the supplied fluid.

Figure 14:
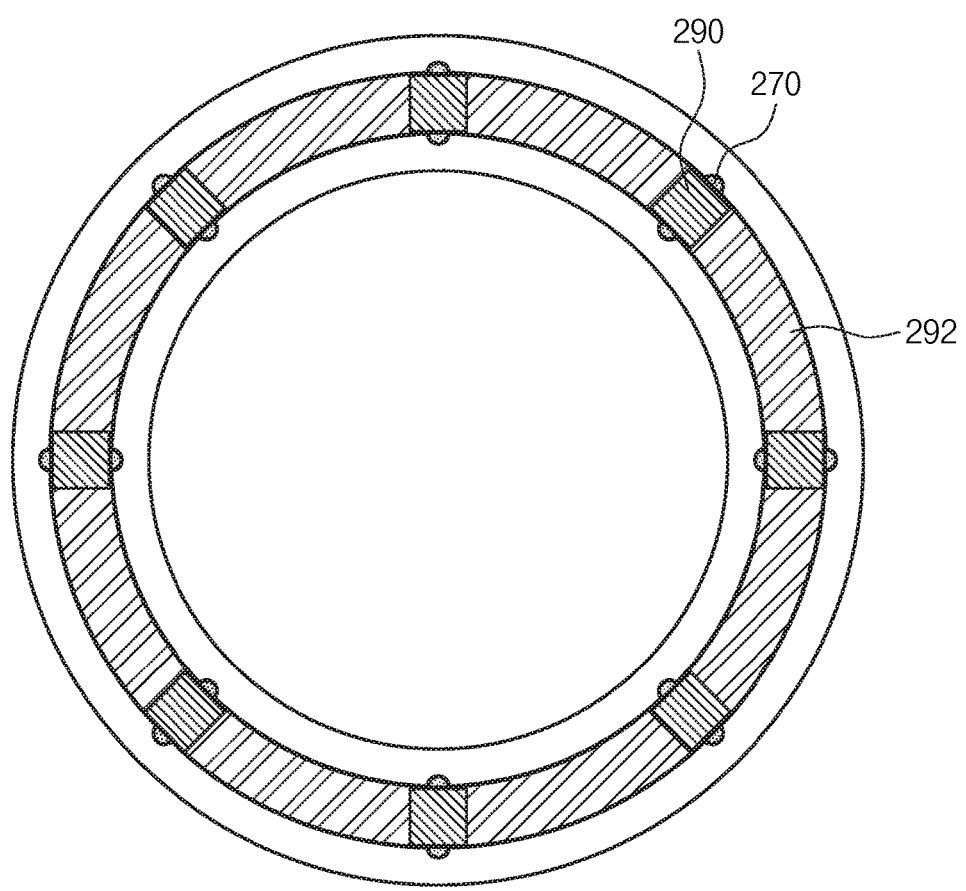
FIG. 14 is a plan view showing a support unit including an actuator according to some embodiments of the inventive concepts.

FIG. 14 is a plan view showing a support unit including an actuator 294 according to some embodiments of the inventive concepts.

Referring to FIG. 14, an actuator 294 and an electric field adjusting ring 290 may be provided in plurality. In some embodiments, the actuator 294 and the electric field adjusting ring 290 may be provided in plurality along a circumferential direction of the body ring 292. The actuators 294 may be symmetrical and the electric field adjusting rings 290 may be symmetrical.

Referring again to FIG. 4, the shower head unit 300 may be disposed over the support unit 200 in the chamber 100. The shower head unit 300 may be located to face the support unit 200. The shower head unit 300 may include a shower head 310, a gas injection plate 320, a heater 323, a cooling plate 340, and an insulating plate 390.

The shower head 310 may be spaced apart downward from a top plate of the chamber 100 by a certain distance. The shower head 310 may be disposed over the support unit 200. A space may be formed between the shower head 310 and the top plate of the chamber 100. The shower head 310 may have a plate shape having a uniform thickness. A bottom surface of the shower head 310 may be treated by an anodizing treatment to prevent arc occurring by plasma. A cross section of the shower head 310 may have the same shape as the support unit 200, and the shower head 310 may have the same cross-sectional area as the support unit 200. The shower head 310 may include a plurality of injection holes 311. The injection hole 311 may vertically penetrate the top surface and the bottom surface of the shower head 310.

The gas injection plate 320 may be disposed on the shower head 310. The gas injection plate 320 may be disposed at a certain distance from the top plate of the chamber 100. The gas injection plate 320 may have a plate shape having a uniform thickness.

The cooling plate 340 may be disposed on the gas injection plate 320. The cooling plate 340 may have a plate shape having a uniform thickness. A supply hole 341 may be formed in a center portion of the cooling plate 340. A gas may pass through the supply hole 341. The gas provided through the supply hole 341 may be supplied to a diffusion region 322 of the gas injection plate 320. A cooling fluid path 343 may be formed within the cooling plate 340. A cooling fluid may be supplied into the cooling fluid path 343. For example, the cooling fluid may be cooling water.

The cooling plate 340 may be formed of a metal material. Electric power may be provided to the cooling plate 340. The cooling plate 340 may be electrically connected to an upper power source 370. The upper power source 370 may be a high-frequency power source. Alternatively, the cooling plate 340 may be electrically grounded. The cooling plate 340 may be electrically connected to the upper power source 370. Alternatively, the cooling plate 340 may function as a grounded electrode.

The insulating plate 390 may support side portions of the shower head 310, the gas injection plate 320 and the cooling plate 330. The insulating plate 390 may be connected to a sidewall of the chamber 100. The insulating plate 390 may be provided to surround the shower head 310, the gas injection plate 320, and the cooling plate 340. The insulating plate 390 may have a ring shape. The insulating plate 390 may be formed of a non-metal material.

The gas supply unit 400 may supply a process gas into the chamber 100. The gas supply unit 400 may include a gas supply nozzle 410, a gas supply line 420, and a gas storage part 430. The gas supply nozzle 410 may be installed at a central portion of the top plate of the chamber 100. A jet orifice may be formed at a bottom end of the gas supply nozzle 410. The jet orifice may supply the process gas into the chamber 100. The gas supply line 420 may connect the gas supply nozzle 410 to the gas storage part 430. The gas supply line 420 may supply the process gas stored in the gas storage part 430 into the gas supply nozzle 410. A valve 421 may be installed on the gas supply line 420. The valve 421 may open and close the gas supply line 420 and may adjust a flow rate of the process gas supplied through the gas supply line 420.

The plasma source may excite the process gas located in the chamber 100 to a plasma state. In some embodiments of the inventive concepts, a capacitively coupled plasma (CCP) source may be used as the plasma source. The CCP source may include a top electrode and a bottom electrode which are disposed in the chamber 100. In some embodiments, the shower head unit 300 may be used as the top electrode, and the electrode plate 220 may be used as the bottom electrode. In certain embodiments, the cooling plate 340 may be used as the top electrode. High-frequency power may be applied to the bottom electrode, and the top electrode may be grounded. Alternatively, high-frequency powers may be applied to the top electrode and the bottom electrode, respectively. Thus, an electric field may be generated between the top electrode and the bottom electrode. The generated electric field may excite the process gas provided in the chamber 100 to the plasma state.

The liner unit 500 may prevent an inner sidewall of the chamber 100 and the support unit 200 from being damaged during a process. The liner unit 500 may prevent impurities generated during the process from being deposited on the inner sidewall of the chamber 100 and the support unit 200. The liner unit 500 may include an inner liner 510 and an outer liner 530.

The outer liner 530 may be provided on the inner sidewall of the chamber 100. The outer liner 530 may have a space of which top and bottom surfaces are opened. The outer liner 530 may have a cylindrical shape. The outer liner 530 may have a radius corresponding to a radius of the inner sidewall of the chamber 100. The outer liner 530 may be provided along the inner sidewall of the chamber 100.

The outer liner 530 may be formed of an aluminum material. The outer liner 530 may protect the inner sidewall of the chamber 100. Arc discharge may occur in the chamber 100 when the process gas is excited. The arc discharge may damage the chamber 100. The outer liner 530 may protect the inner sidewall of the chamber 100 to prevent the inner sidewall of the chamber 100 from being damaged by the arc discharge.

The inner liner 510 may be provided to surround the support unit 200. The inner liner 510 may have a ring shape. The inner liner 510 may surround the support plate 210, the electrode plate 220, and the lower plate 240. The inner liner 510 may be formed of an aluminum material. The inner liner 510 may protect an outer sidewall of the support unit 200.

The baffle unit 600 may be disposed between the inner sidewall of the chamber 100 and the support unit 200. The baffle unit 600 may have a ring shape. A plurality of through-holes may he formed in the baffle unit 600. The process gas provided in the chamber 100 may pass through the through-holes of the baffle unit 600 and may be then exhausted to the exhaust hole 102. A flow of the process gas may be controlled according to a shape of the baffle unit 600 and shapes of the through-holes.

A method for treating a substrate by using the substrate treating apparatus according to the inventive concepts will be described hereinafter.

The electrode plate 220, the electric field adjusting ring 290, the focus ring 280, and the body ring 292 may be in contact with each other. Thus, when the high-frequency power is applied, the electric field may be changed according to the height of the electric field adjusting ring 290.

Figure 15:
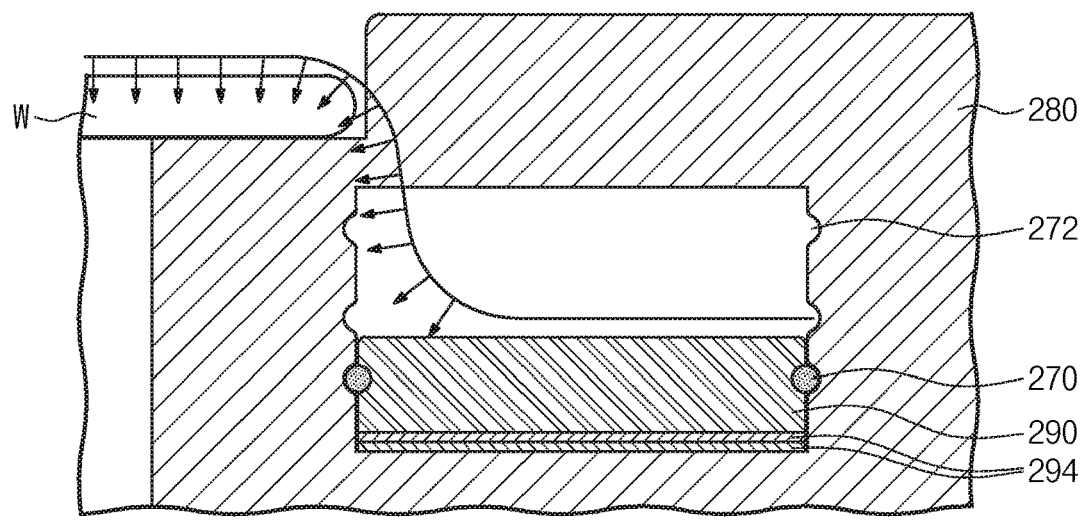
FIGS. 15 and 16 are views a change of an electric field and a change of an incident angle of etching ions, according to some embodiments of the inventive concepts.
Figure 16:
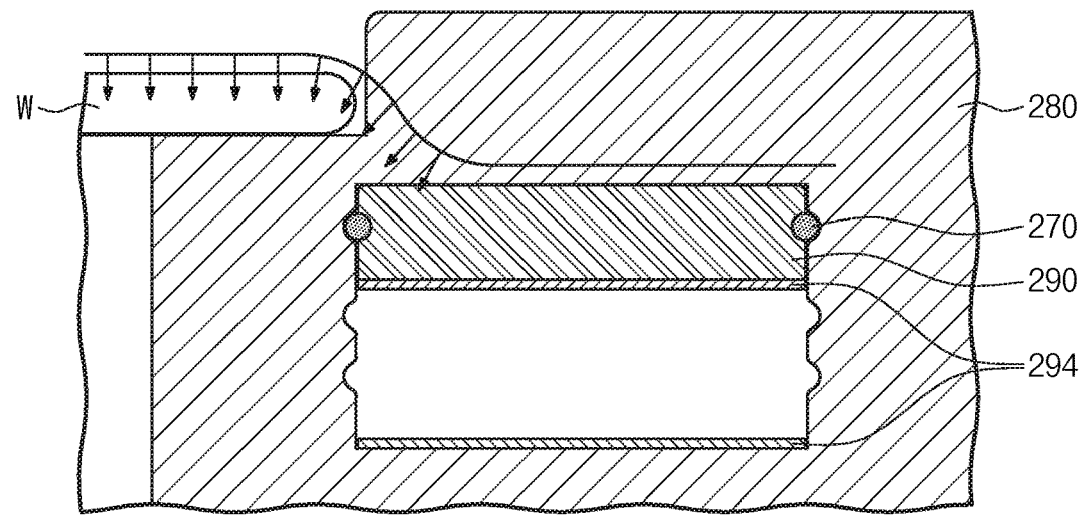

FIGS. 15 and 16 are views a change of an electric field and a change of an incident angle of etching ions, according to some embodiments of the inventive concepts.

When an etching process is performed, the focus ring 280 may also be etched. Referring to FIG, 15, an incident angle of etching ions faces the inside of a substrate W when the electric field adjusting ring 290 is disposed in a lower region of the inner space S. Thus, an undesired region of the substrate W may be etched to lower accuracy of the process. As shown in FIG. 16, when the electric field adjusting ring 290 is raised, the electric field may be generated at a position higher than a previous position of the electric field. Thus, it is possible to inhibit the incident angle of the etching ions from being rapidly changed toward the inside of the substrate W. As a result, the accuracy of the process may be improved, and a replacement period of the focus ring 280 may be increased. When a condition of the process reaches a set condition, the controller 298 may raise the electric field adjusting ring 290. The set condition may be variously set using a process time, a slope critical dimension (SCD), or the number of completely etched substrates. For example, when the process time, the SCD, or the number of the completely etched substrates reaches a set value, the controller 298 may control the actuator 294 to raise the electric field adjusting ring 290. In the case in which the actuator 294 includes the magnetic force members, the current may be supplied to the coil to apply the repulsive force between the magnetic force members. Thus, the electric field adjusting ring 290 may be raised. Alternatively, the fluid may be supplied into the inner space S to raise the electric field adjusting ring 290 by the fluid pressure.

Figure 17:
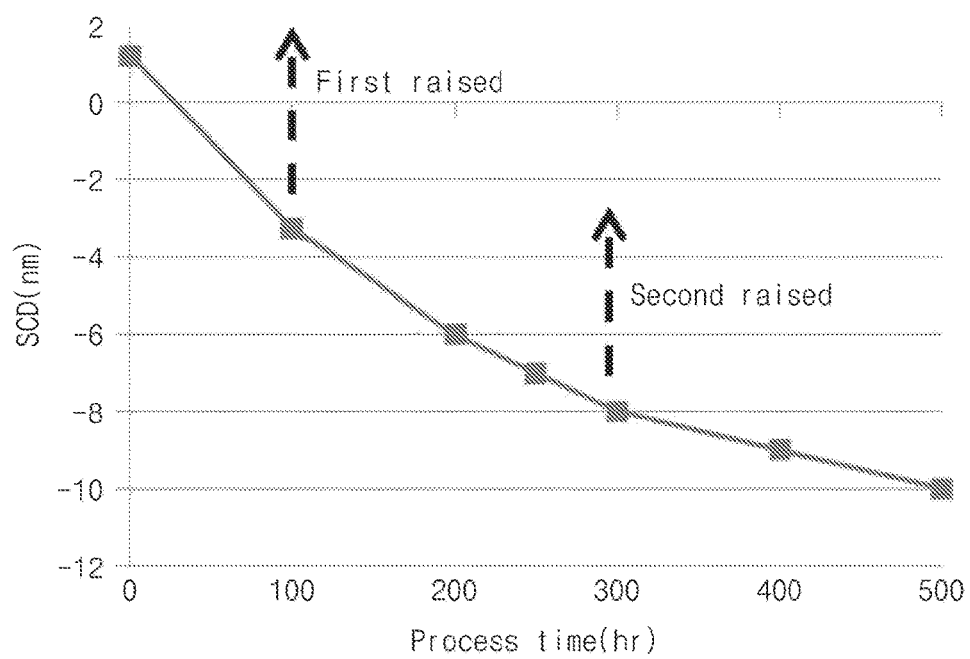
FIG. 17 is a graph showing a variation of a slope critical dimension according to a process time by some embodiments of the inventive concepts.

FIG. 17 is a graph showing a variation of a slope critical dimension according to a process time by some embodiments of the inventive concepts.

The electric field adjusting ring 290 may be raised one or more times. When the electric field adjusting ring 290 is raised a plurality of times, the distances between the concave regions 272 may be different from each other. Thus, raised heights of the electric field adjusting ring 290 may be different from each other. Alternatively, the distances between the concave regions 1272 may be equal to each other. Thus, raised heights of the electric field adjusting ring 290 may be equal to each other. As a result, the incident angle of the etching ions may be suitably adjusted according to a process. The controller 2298 may raise the electric field adjusting ring 290 stepwise each time to reach the set condition.

In the above mentioned embodiments, the electric field adjusting ring moves upward by the magnetic force or the fluid pressure. However, embodiments of the inventive concepts are not limited thereto. In certain embodiments, the electric field adjusting ring may be raised by an additional motor.

In addition, even though not shown in the drawings, the plate, the body, and the coil may be provided in film forms in each of the first and second magnetic force members.

In the above mentioned embodiments, the electric field adjusting ring may be raised and may be fixed on the sidewall of the inner space by the bearing. However, the electric field adjusting ring may not be fixed. The electric field adjusting ring may be supported by the repulsive force generated by the magnetic force or by the fluid pressure.

According to some embodiments of the inventive concepts, it is possible to improve the accuracy and the efficiency of the etching process performed on a substrate.

In addition, according to some embodiments of the inventive concepts, it is possible to reduce a cost necessary for the replacement or maintenance of the focus ring.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A substrate treating apparatus comprising:
    a process chamber in which a treatment space is provided;
    a support unit configured to support a substrate in the process chamber;
    a gas supply unit configured to supply a gas into the process chamber; and
    a plasma source configured to generate plasma from the gas,
    the support unit including,
        a support plate on which a substrate is loaded,
        a focus ring surrounding the support plate,
        a body ring under the focus ring,
        a first concave formed in a lower portion of the focus ring, and a second concave formed in a upper portion of the body ring,
        an inner space defined by combining the first concave of the focus ring and the second concave of the body ring,
        an electric field adjusting ring disposed in the inner space under the focus ring, and
        an actuator configured to vertically move the electric field adjusting ring.

2. The substrate treating apparatus of claim 1, wherein the electric field adjusting ring is configured to be vertically moved in the inner space.

3. The substrate treating apparatus of claim 2, wherein the actuator vertically is configured to move the electric field adjusting ring by magnetic force.

4. The substrate treating apparatus of claim 3, wherein the actuator comprises:
    a first magnetic force member fixed to the electric field adjusting ring; and
    a second magnetic force member facing the first magnetic force member and provided in the inner space.

5. The substrate treating apparatus of claim 4, wherein the first magnetic force member is fixed on a bottom surface of the electric field adjusting ring, and
    wherein the second magnetic force member is provided on a bottom surface of the inner space.

6. The substrate treating apparatus of claim 4, wherein one of the first and second magnetic force members comprises: a body formed of a conductive material; and a coil surrounding the body,
    wherein the other of the first and second magnetic force members is a magnetic body,
    wherein the actuator further comprises:
        a current supply part configured to supply a current to the coil,
        wherein repulsive force is applied between the first magnetic force member and the second magnetic force member when the current flows through the coil.

7. The substrate treating apparatus of claim 6, wherein the actuator further comprises:
    a controller configured to adjust an intensity of the current supplied from the current supply part,
    wherein the controller is configured to adjust the intensity of the current when a condition of a process reaches a set condition.

8. The substrate treating apparatus of claim 4, wherein the first magnetic force member comprises:
    a first body formed of a conductive material; and
    a first coil spaced apart from the first body and surrounding the first body,
    wherein the second magnetic force member comprises:
        a second body formed of a conductive material; and
        a second coil spaced apart from the second body and surrounding the second body,
    wherein the actuator further comprises:
        a current supply part configured to supply a current to each of the first coil and the second coil,
        wherein repulsive force is applied between the first magnetic force member and the second magnetic force member when the current is supplied to the first coil and the second coil.

9. The substrate treating apparatus of claim 8, wherein at least one of the first and second magnetic force members is provided in a film form.

10. The substrate treating apparatus of claim 2, wherein the actuator is configured to vertically move the electric field adjusting ring by at least one of hydraulic pressure or air pressure.

11. The substrate treating apparatus of claim 10, wherein the actuator comprises:
    a fluid supply pipe configured to supply a fluid into a region under the electric field adjusting ring in the inner space.

12. The substrate treating apparatus of claim 11, wherein the actuator further comprises:
    a flow rate adjuster configured to adjust a flow rate of the fluid supplied into the inner space through the fluid supply pipe; and
    a controller configured to control the flow rate adjuster,
    wherein the controller is configured to control the flow rate adjuster to change the flow rate of the fluid when a condition of a process reaches a set condition.

13. The substrate treating apparatus of claim 2, wherein a bearing is provided on a sidewall of the electric field adjusting ring, and wherein a concave region is formed in a sidewall of the inner space such that a portion of the bearing is inserted into the concave region.

14. The substrate treating apparatus of claim 13, wherein the concave region is provided in plurality in an up-and-down direction.

15. The substrate treating apparatus of claim 14, wherein distances between the concave regions arranged in the up-and-down direction are different from each other.

16. A support unit for supporting a substrate, the support unit comprising:
a support plate on which a substrate is loaded;
a focus ring surrounding the support plate;
a body ring under the focus ring,
a first concave formed in a lower portion of the focus ring, and a second concave formed in a upper portion of the body ring,
an inner space defined by combining the first concave of the focus ring and the second concave of the body ring,
an electric field adjusting ring disposed in the inner space under the focus ring; and
an actuator configured to vertically move the electric field adjusting ring.

17. The support unit of claim 16,
wherein the electric field adjusting ring is configured to be vertically moved in the inner space.

18. The support unit of claim 17, wherein the actuator is configured to vertically move the electric field adjusting ring by magnetic force.

19. The support unit of claim 18, wherein the actuator comprises:
a first magnetic force member fixed to the electric field adjusting ring; and
a second magnetic force member facing the first magnetic force member and provided in the inner space,
wherein the first magnetic force member is fixed on a bottom surface of the electric field adjusting ring, and
wherein the second magnetic force member is provided on a bottom surface of the inner space.

20. The support unit of claim 19, wherein one of the first and second magnetic force members comprises: a body formed of a conductive material; and a coil surrounding the body,
wherein the other of the first and second magnetic force members is a magnetic body,
wherein the actuator further comprises:
a current supply part configured to supplying a current to the coil,
wherein repulsive force is applied between the first magnetic force member and the second magnetic force member when the current flows through the coil.

21. he support unit of claim 19, wherein the first magnetic force member comprises:
a first body formed of a conductive material; and
a first coil spaced apart from the first body and surrounding the first body,
wherein the second magnetic force member comprises:
a second body formed of a conductive material; and
a second coil spaced apart from the second body and surrounding the second body,
wherein the actuator further comprises:
a current supply part configured to supply a current to the first coil and the second coil,
wherein repulsive force is applied between the first magnetic force member and the second magnetic force member when the current is supplied to the first coil and the second coil.

22. The support unit of claim 21, wherein at least one of the first and second magnetic force members is provided in a film form.

23. The support unit of claim 17, wherein the actuator is configured to vertically move the electric field adjusting ring by at least one of hydraulic pressure or air pressure.

24. The support unit of claim 23, wherein the actuator comprises:
a fluid supply pipe configured to supply a fluid into a region under the electric field adjusting ring in the inner space.

25. The support unit of claim 17, wherein a bearing is provided on a sidewall of the electric field adjusting ring, and
wherein a concave region is formed in a sidewall of the inner space such that a portion of the bearing is inserted into the concave region.

26. The support unit of claim 25, wherein the concave region is provided in plurality in an up-and-down direction.

27. The support unit of claim 26, wherein distances between the concave regions arranged in the up-and-down direction are different from each other.

28. A substrate treating apparatus comprising:
a process chamber in which a treatment space is provided;
a support unit configured to support a substrate in the process chamber;
a gas supply unit configured to supply a gas into the process chamber; and
a plasma source configured to generate] plasma from the gas, the support unit including,
a support plate on which a substrate is loaded,
a focus ring surrounding the support plate,
a body ring under the focus ring, and the body ring and the focus ring defining an inner space therebetween,
an electric field adjusting ring disposed in the inner space under the focus ring, and
an actuator configured to vertically move the electric field adjusting ring,
wherein the electric field adjusting ring does not overlap with the substrate when viewed from above.

29. The substrate treating apparatus of claim 28, wherein the electric field adjusting ring is configured to be vertically moved in the inner space.

* * * * *